(12) United States Patent
Hsieh

(10) Patent No.: US 6,605,509 B1
(45) Date of Patent: Aug. 12, 2003

(54) METHOD FOR FORMING SMOOTH FLOATING GATE STRUCTURE FOR FLASH MEMORY

(75) Inventor: Wen-Kuei Hsieh, Hsin-Chu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/251,962

(22) Filed: Sep. 23, 2002

(51) Int. Cl.[7] .......................................... H01L 21/8247
(52) U.S. Cl. ........................ 438/264; 438/296; 438/634
(58) Field of Search ................................. 438/257, 258, 438/259, 260, 264, 267, 296, 634, 657

(56) References Cited

U.S. PATENT DOCUMENTS

| 6,342,451 | B1 | * | 1/2002 | Ahn ............................. 438/706 |
| 6,413,809 | B2 | * | 7/2002 | Nakamura et al. ........... 438/296 |
| 6,500,756 | B1 | * | 12/2002 | Bell et al. .................... 438/657 |
| 6,559,008 | B2 | * | 5/2003 | Rabkin et al. ............... 438/259 |

* cited by examiner

Primary Examiner—Chandra Chaudhari
(74) Attorney, Agent, or Firm—Rosenberg, Klein & Lee

(57) ABSTRACT

A method for forming a smooth floating gate structure for a flash memory is disclosed. The method comprises the following steps. A substrate is firstly provided, and a first conductive layer and a second conductive layer are sequentially formed on the substrate. A first dielectric layer is then formed on the second conductive layer. A first hard mask layer and a second hard mask layer are formed sequentially on the first dielectric layer. A floating gate pattern is then transferred into the second hard mask layer to expose the first hard mask layer. The first hard mask layer is then etched to form a pattern and expose the first dielectric layer. A second dielectric layer is conformally formed over the second hard mask layer and the pattern; The second dielectric layer is etched back to form a spacer and expose the first dielectric layer. The first dielectric layer is then etched to expose the second conductive layer and the spacer, the second hard mask layer, the first hard mask layer and the first dielectric layer are finally removed.

17 Claims, 6 Drawing Sheets

US 6,605,509 B1

METHOD FOR FORMING SMOOTH FLOATING GATE STRUCTURE FOR FLASH MEMORY

BACKGROUND OF THE INVENTION

1. Field of the Invention

The present invention relates to a method for forming a floating gate structure for a flash memory, and more particularly to a method for forming a smooth floating gate structure for a flash memory.

2. Description of the Related Art

Non-volatile semiconductor memory devices, such as EEPROM and "flash" devices, are both electrically erasable and writable (or programmable). Such devices retain data even after power is shut down. Similarly, erasable programmable logic integrated circuits (EPLD, or PLD) use non-volatile memory cells to achieve certain reprogrammable logic functions. Non-volatile memory devices and PLDs, have a limited lifetime due to the endurance related stress such devices suffer each time they go through a program-erase cycle. The endurance of such devices is its ability to withstand a given number of program-erase cycles.

A main component of a cell of a non-volatile memory device or a PLD, is a floating gate, in a field effect transistor structure, disposed over but insulated from a channel region which is disposed between a source region and a drain region in a semiconductor substrate. A control or select gate is generally disposed over the floating gate, and is insulated therefrom by a dielectric layer. Alternatively, a control "gate" can be implemented by an adjacent diffused region of the substrate that is also insulated from the floating gate. The floating gate is, therefore, surrounded by an electrically insulating dielectric.

The threshold voltage is the minimum amount of voltage that must be applied to the control gate before the transistor is turned "on" to permit conduction between its source and drain regions, and is a function of the level of charge on the floating gate. The control gate acts as a word line to enable reading or writing of a single selected cell in a two-dimensional array of cells (i.e., a non-volatile memory device or PLD). A cell is "erased" by holding the control gate and its source and drain regions at appropriate voltages so that electrons travel from the substrate through an intervening oxide layer (i.e., a tunnel oxide layer or a tunnel oxide) and onto the floating gate. If enough electrons are collected on the floating gate, the conductivity of the channel of the field effect transistor of the cell is changed. By measuring the conductivity of the cell, it is determined whether a binary "1" or "0" is being stored. Since the floating gate of the cell is well insulated, the cell is not volatile and retains its charge for an indefinite period without any power being applied to it.

A cell or group of cells in a non-volatile memory device or a PLD, are also "programmable." During programming, the control gate, the source and the drain regions, of a cell are held at a potential that causes electrons to move back through the tunnel oxide and into the substrate, usually the source region of the substrate. This movement reverses the effect of an earlier erase operation.

Reliability assurance is a costly, time consuming, difficult and important task in integrated circuit (IC) development and production. This is particularly true with non-volatile memory devices and PLDs. Such devices are subject to the usual IC failure mechanisms such as package and bonding failures, electrostatic discharge, electromigration, oxide breakdown, etc. Additionally, such devices must meet other reliability requirements. For example, they must retain data for ten years and must function normally (within specifications) after repeated program and erase operations, i.e., program-erase cycles.

FIGS. 1A–1F show a process flow of a conventional method for forming a floating gate of a flash memory. As shown in FIG. 1A, a tunnel oxide 106, a polysilicon layer 102 (the first floating gate layer), a pad SiN layer 104 and a photoresist layer 108 are formed on a Si substrate 100. The photoresist layer 108 is then patterned to expose the pad SiN layer 104. The pad SiN layer 104, the polysilicon layer 102, the tunnel oxide 106 and the Si substrate 100 are then etched to form trenches, and the trenches are filled with a dielectric layer 110 to form shallow trench isolations (STI) as shown in FIG. 1B. The pad SiN layer 104 is removed and the dielectric layer 110 is etched to the surface level of the polysilicon layer 102. A polysilicon layer 112 (the second floating gate layer) and a pad SiN layer 114 are formed as shown in FIG. 1C. A floating gate pattern is formed into the pad SiN layer 114 and the second polysilicon layer 112. A SiN layer 116 is formed and is then etched to form SiN spacers as shown in FIG. 1D. The second polysilicon layer 112 is then etched to expose the dielectric layer 110 or the STI in FIG. 1E. The pad SiN layer. 114 and the SiN layer 116 are removed and the floating gate is formed in FIG. 1F. The profile of the floating gate shown in FIG. 1F has many corners which would cause charge loss amid alternatively programming and erasing the floating gate, i.e., program-erase cycling thereby degrading the retention time and the reliability of this conventional flash memory. Moreover, theses. undesired corners also affect the word line topology of this conventional flash memory.

In view of the drawbacks mentioned with the prior art process, there is a continued need to develop new and improved processes that overcome the disadvantages associated with prior art processes. The advantages of this invention are that it solves the problems mentioned above.

SUMMARY OF THE INVENTION

It is therefore an object of the invention to provide a method for forming a floating gate structure of a flash memory which can eliminate the floating gate corner effect.

It is another object of this invention to provide a smooth floating gate structure of a flash memory.

It is a further object of this invention to provide a reliable floating gate structure of a flash memory having superior charge retention characteristics.

To achieve these objects, and in accordance with the purpose of the invention, the invention provides a method for forming a floating gate structure of a flash memory. The method comprises the following steps. A substrate is firstly provided, and a first conductive layer and a second conductive layer are sequentially formed on the substrate. A first dielectric layer is then formed on the second conductive layer. A first hard mask layer and a second hard mask layer are formed sequentially on the first dielectric layer. A floating gate pattern is then transferred into the second hard mask layer to expose the first hard mask layer. The first hard mask layer is then etched to form a pattern and expose the first dielectric layer. A second dielectric layer conformally formed over the second hard mask layer and the pattern. The second dielectric layer is etched back to form a spacer and expose the first dielectric layer. The first dielectric layer is then etched to expose the second conductive layer and the spacer, the second hard mask layer, the first, hard mask layer and the first dielectric layer are finally removed.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by, reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1A:
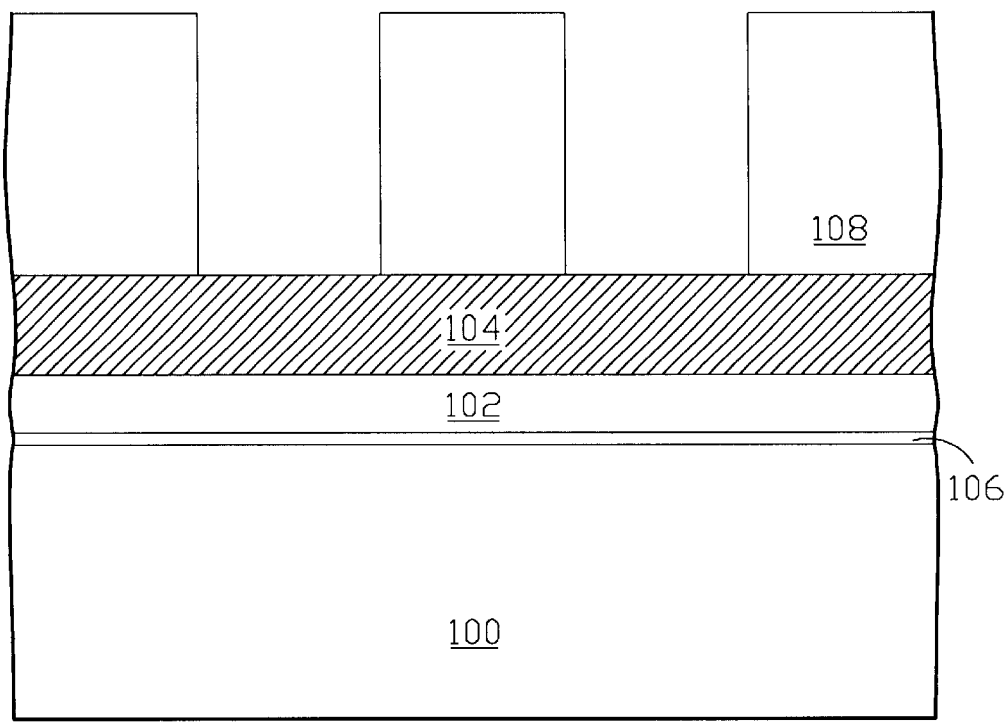
FIG. 1A shows the result of forming a tunnel oxide, a polysilicon layer, a pad SiN layer and a photoresist layer on a Si substrate.
Figure 1B:
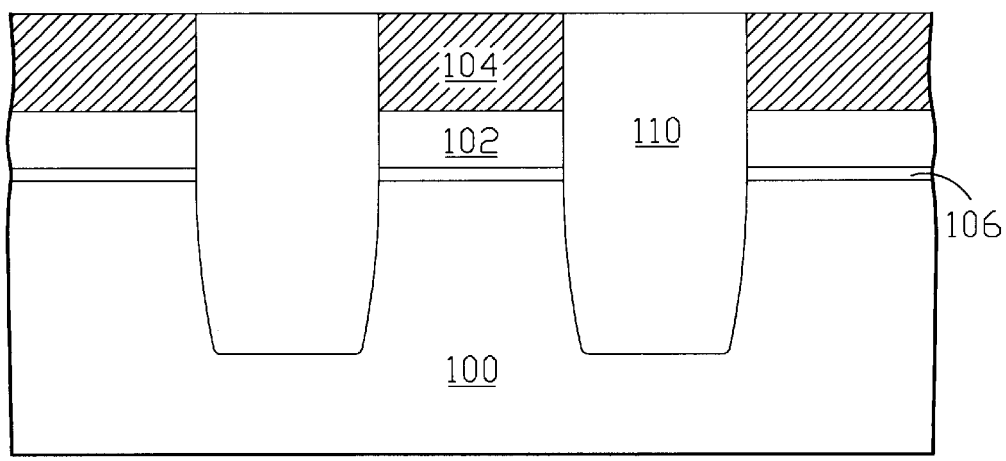
FIG. 1B shows the result of etching the pad SiN layer, the polysilicon layer, the tunnel oxide and the Si substrate to form trenches, and filling the trenches with a dielectric layer to form STIs.
Figure 1C:
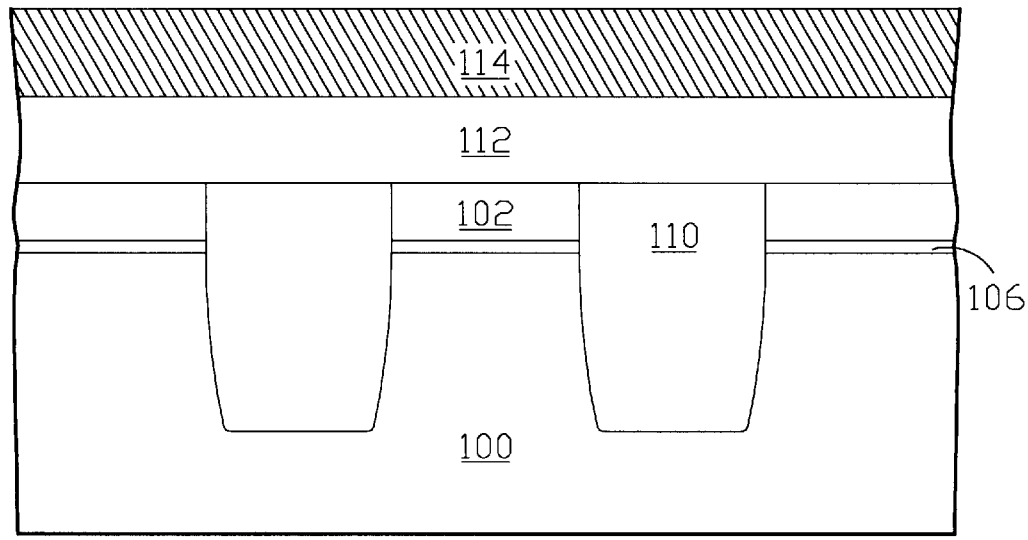
FIG. 1C shows the result of removing the pad SiN layer, etching the dielectric layer to the surface level of the polysilicon layer, and forming a second polysilicon layer and a pad SiN layer.
Figure 1D:
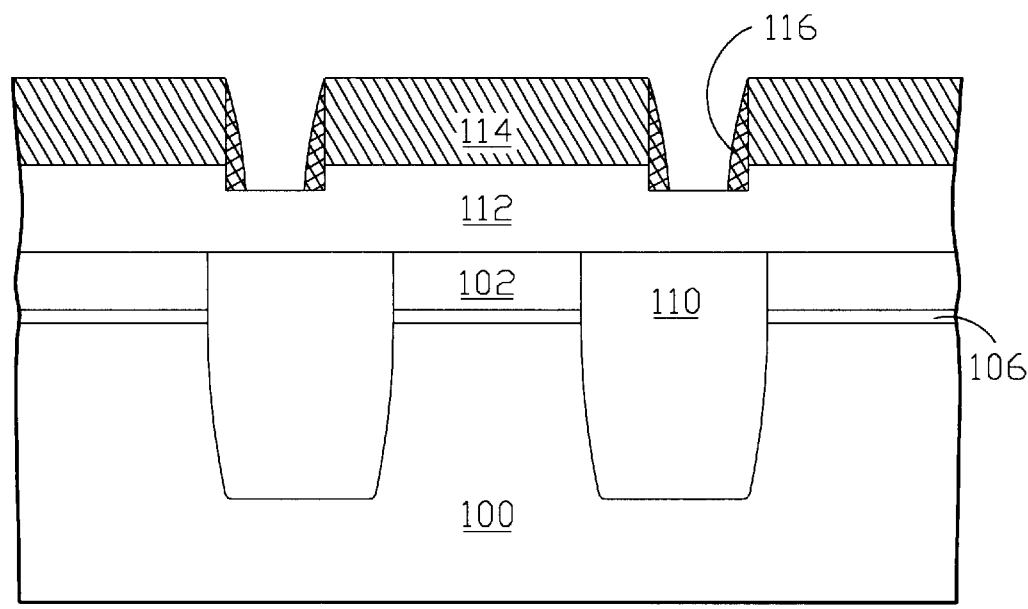
FIG. 1D shows the result of forming a floating gate pattern into the pad SiN layer and the second polysilicon layer, and forming and etching a SiN layer to form SiN spacers.
Figure 1E:
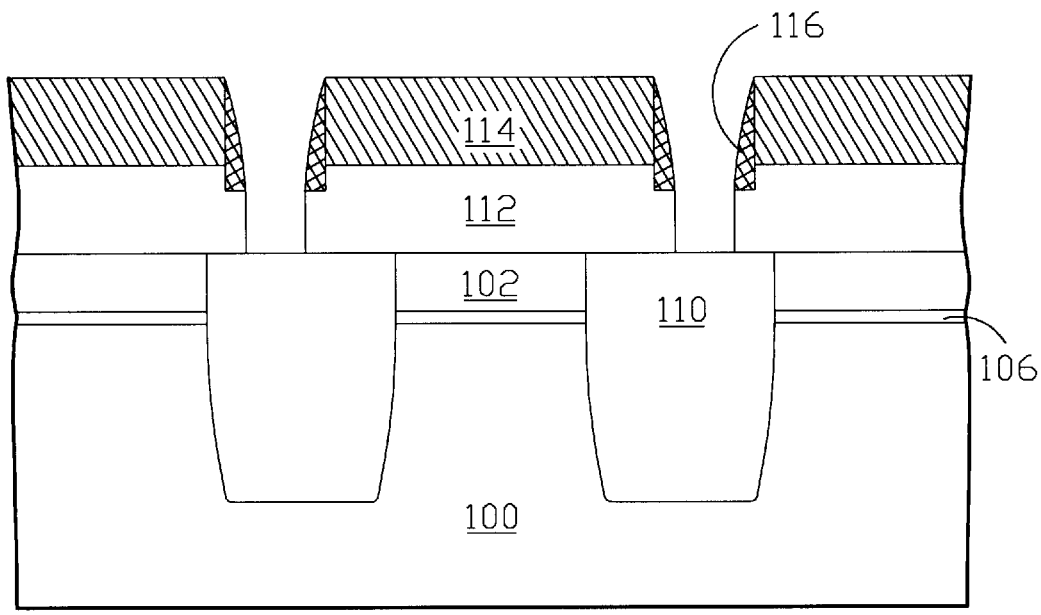
FIG. 1E shows the result of etching the second polysilicon layer. to expose the dielectric layer or the STI.
Figure 1F:
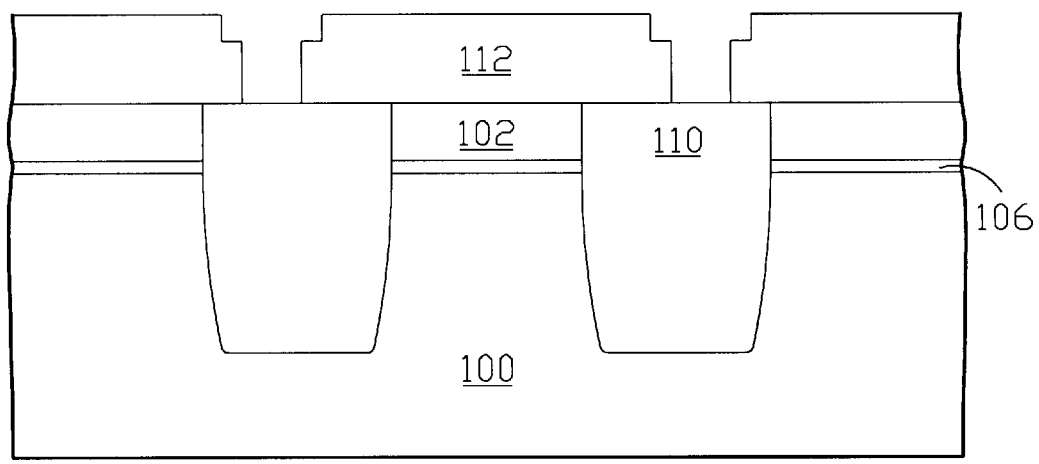
FIG. 1F shows the result of removing the pad SiN layer and the SiN layer.
Figure 2A:
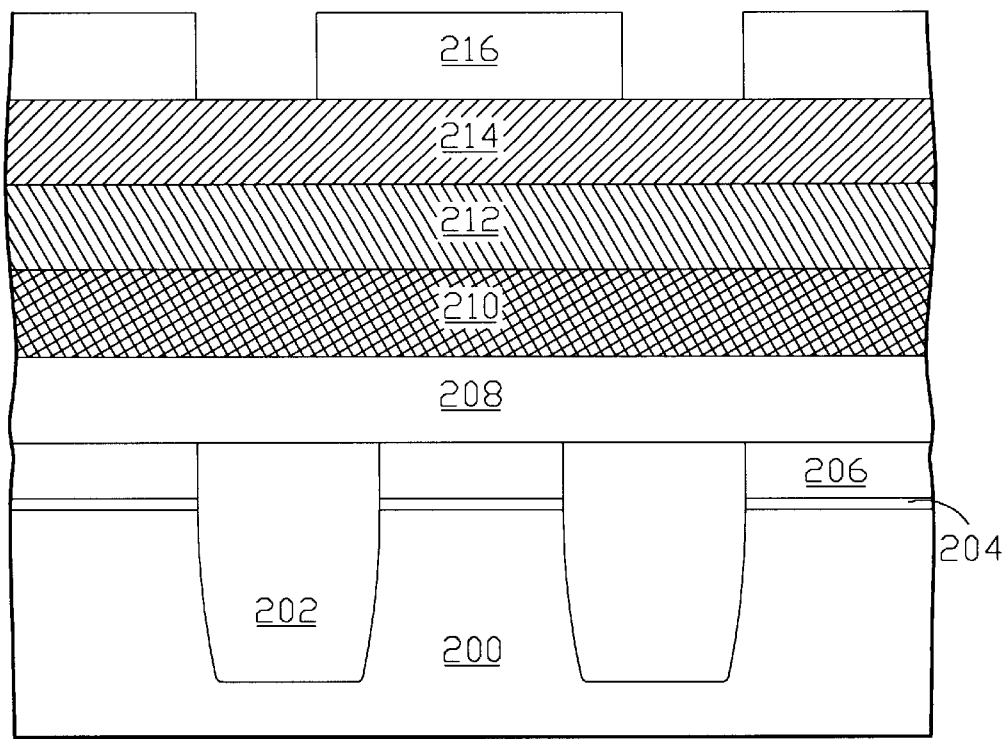
FIG. 2A shows a substrate having STIs therein, an oxide layer, two conductive layers, three dielectric layers, and a photoresist layer thereon.

Referring to FIG. 2A, a substrate 200 having STIs 202 therein, an oxide layer 204, conductive layers 206 and 208, dielectric layers 210, 212 and 214, and a photoresist layer 216 thereon is shown. The substrate 200 preferably comprises, but is not limited to: a silicon substrate with a <100 >crystalline orientation. The oxide layer 204, the conductive layer 206 and a dielectric layer comprising a pad SiN (not shown) layer are firstly formed on the substrate 200. The oxide layer 204 can be formed by conventional oxidation methods in the art. A conventional photolithography process is then performed to define active areas and expose the predetermined STI regions. The dielectric layer (not shown), the conductive layer 206, the oxide layer 204 and the substrate 200 are etched by an etching process comprising reactive ion etching processes to form trenches and a dielectric layer 202 comprising high-density plasma (HDP) oxide layer is filled into the trenches. A chemical mechanical polishing process is then performed to provide a planar surface. The dielectric layer 202 is then etched to the surface level of the conductive layer 206 by conventional etching processes. The dielectric layer (not shown) is then removed and a conductive layer 208 is formed over the conductive layer 206 and the STI 202. The conductive layers 206 and 208 preferably comprise polysilicon layers formed by conventional chemical vapor deposition processes. The dielectric layers 210, 212 and 214 are sequentially formed by conventional deposition processes. The dielectric layer 210 preferably comprises a SiN layer. The dielectric layers 212 and 214 are used as etching hard masks amid the photolithography and etching processes of defining the floating gate. The dielectric layers 212 comprises a photoresist layer and the dielectric 214 comprises a SOG layer. The photoresist layer 216 is formed and patterned to define the floating gate.

Figure 2B:
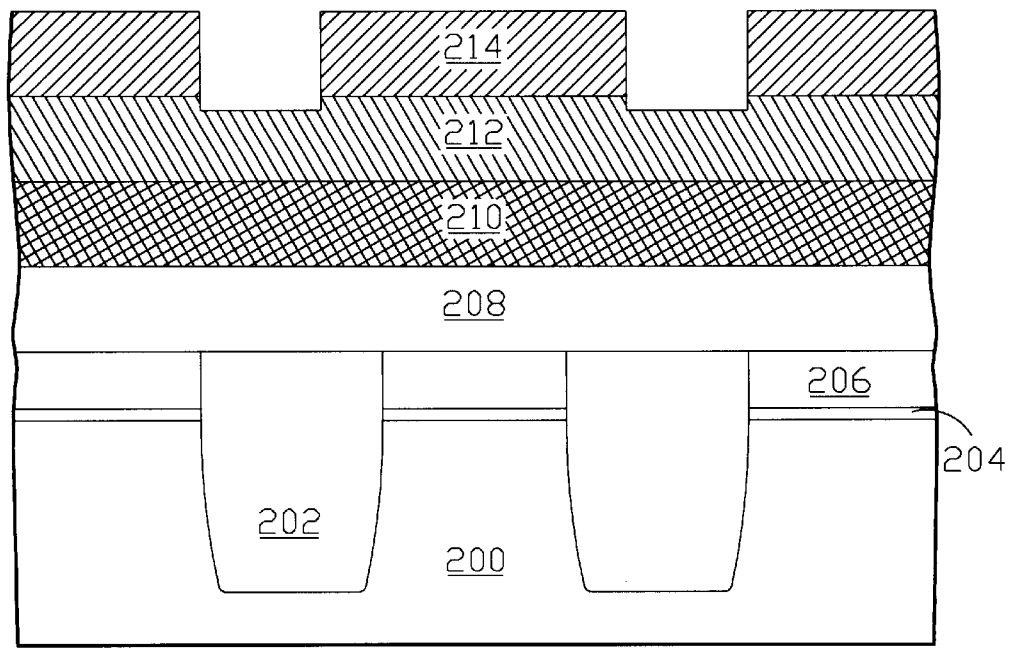
FIG. 2B shows the result of etching the upper dielectric layer to expose the middle dielectric layer and removing the photoresist layer.
Figure 2C:
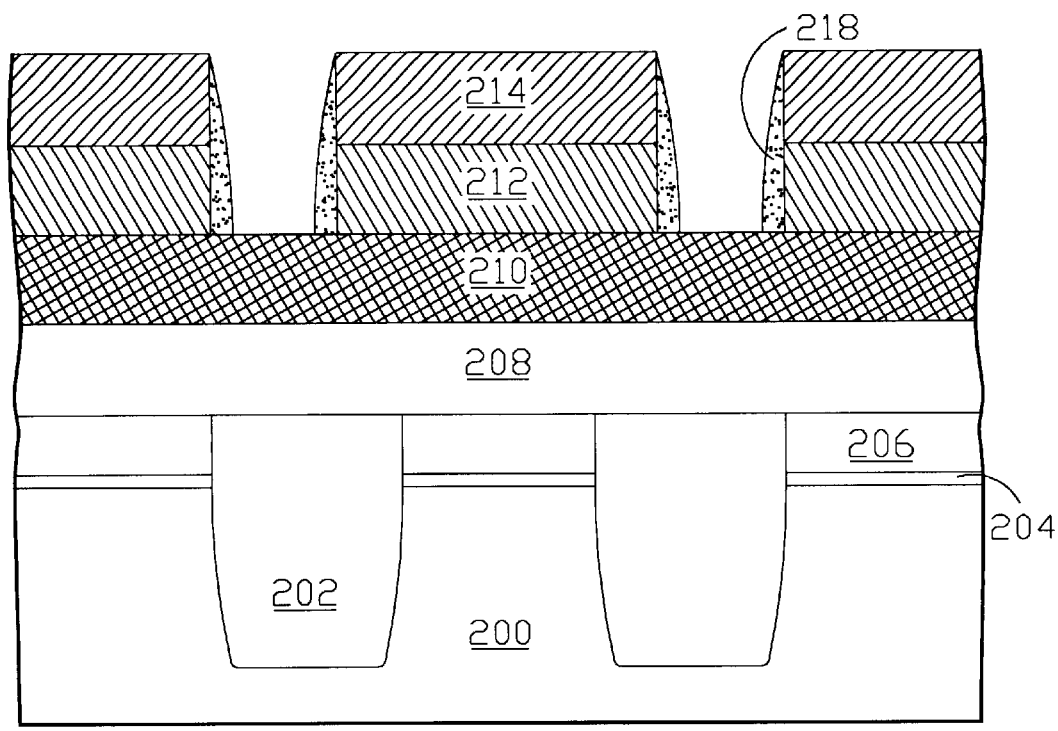
FIG. 2C shows the result of etching the middle dielectric layer to expose the lower dielectric layer, and forming and etching back a dielectric layer to form spacers.
Figure 2D:
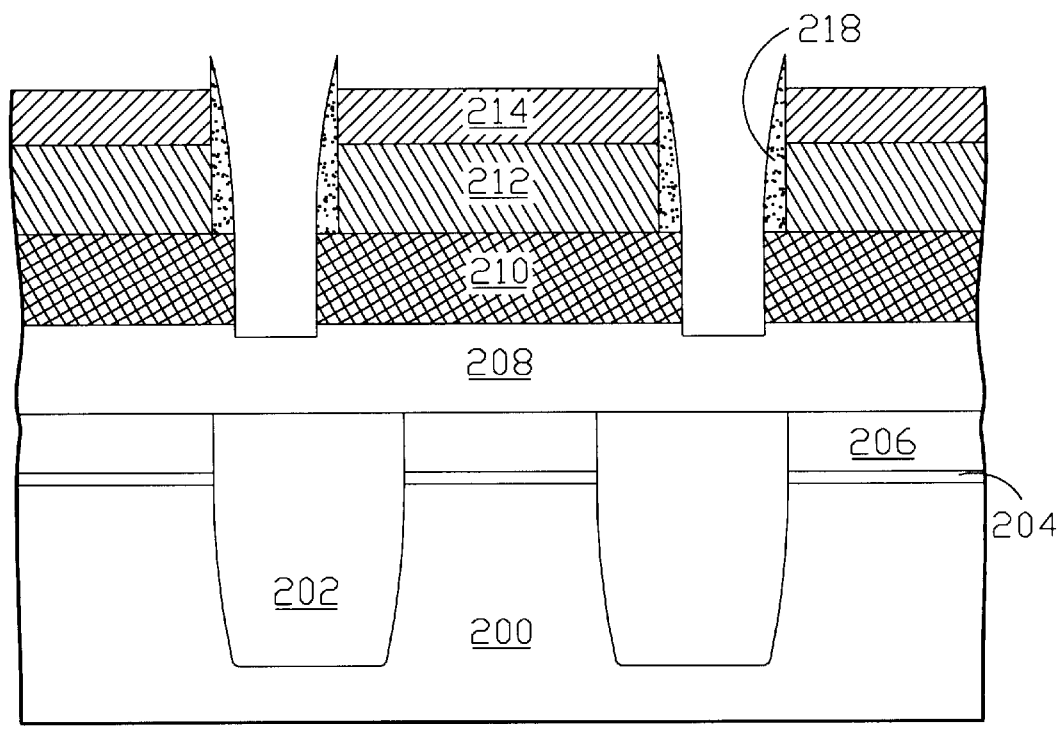
FIG. 2D shows the result of etching the bottom dielectric layer to expose the conductive layer by using the upper dielectric layer as an etching mask.
Figure 2E:
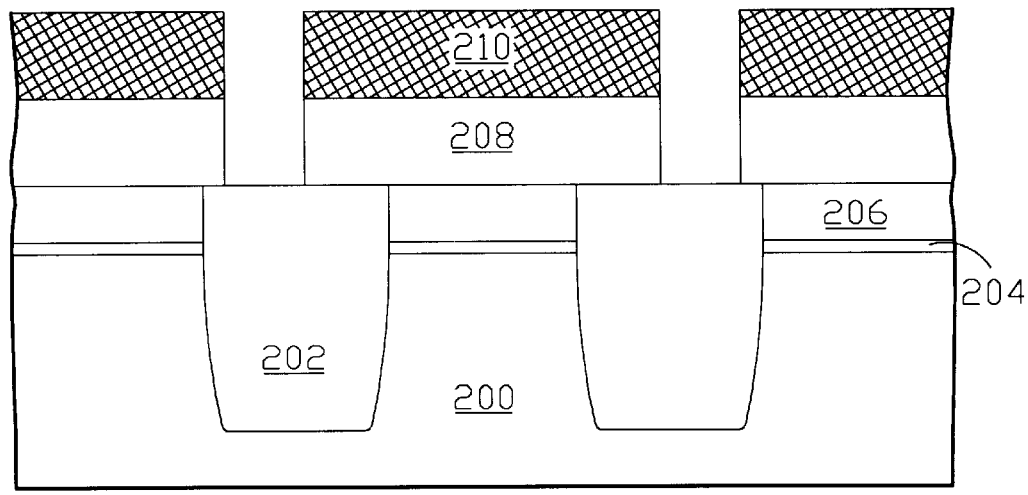
FIG. 2E shows the result of removing the dielectric spacers, the upper and middle dielectric layers, and etching the conductive layer to expose the STIs.
Figure 2F:
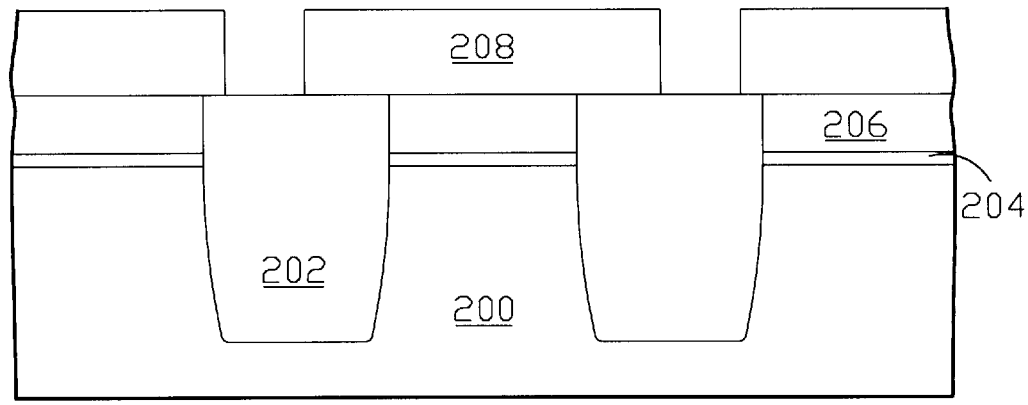
FIG. 2F shows the result of removing the bottom dielectric layer.

FIG. 2B shows the result of etching the dielectric layer 214 to expose the dielectric layer 212 and removing the photoresist layer 216. The dielectric layer 214 is etched by conventional etching methods and the photoresist layer 216 is removed by conventional methods. FIG. 2C shows the result of etching the dielectric layer 212 to expose the dielectric layer 210, and forming a dielectric layer 218 to form spacers. The dielectric layer 218 preferably comprises a polymer layer. FIG. 2D shows the result of etching the dielectric layer 210 to expose the conductive layer 208 by using the dielectric layer 214 as an etching mask. The dielectric layer 210 can be etched by conventional etching methods FIG. 2E shows the result of removing the dielectric spacers 218, the dielectric layers 214 and 212, and etching the conductive layer 208 to expose the STIs 202 by conventional etching processes. The dielectric layers 214 and 212 can be removed by conventional etching methods. After removing the dielectric layer 210, the floating gate structure of this invention is formed as shown in FIG. 2F. Then an oxide-nitride-oxide (ONO) layer is formed on the floating gate and conventional processes of forming the flash memory can be performed continually. It is apparently that the method of this invention can provide a floating gate profile without undesired corners so as to prevent charge loss amid alternatively programming and erasing the floating gate and retention time degradation. The reliability of the floating gate can be effectively upgraded.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for forming a floating gate structure of a flash memory, said method comprising:

providing a substrate;

forming a first conductive layer and a second conductive layer sequentially on said substrate;

forming a first dielectric layer on said second conductive layer;

forming a first hard mask layer and a second hard mask layer sequentially on said first dielectric layer;

transferring a floating gate pattern into said second hard mask layer to expose said first hard mask layer;

etching said first hard mask layer to form a pattern and expose said first dielectric layer;

conformally forming a second dielectric layer over said second hard mask layer and said pattern;

etching back said second dielectric layer to form a spacer and expose said first dielectric layer;

etching said first dielectric layer to expose said second conductive layer; and removing said spacer, said second hard mask layer, said first hard mask layer and said first dielectric layer.

2. The method according to claim 1, wherein said first conductive layer and said second conductive layer comprise polysilicon layers.

3. The method according to claim 1, wherein said first dielectric layer comprise a SiN layer.

4. The method according to claim 1, wherein said first hard mask layer comprises a photoresist layer.

5. The method according to claim 1, wherein said second dielectric layer comprises a polymer layer.

6. The method according to claim 1, wherein said floating gate pattern is formed by forming a photoresist layer on said second hard mask layer, patterning said photoresist layer and etching said second hard mask layer by using said patterned photoresist layer as an etching mask.

7. A method for forming a floating gate structure of a flash memory, said method comprising:

providing a substrate having a pad oxide layer, a first conductive layer and a first dielectric layer thereon;

transferring a shallow trench isolation pattern into said pad oxide layer, said first conductive layer, said first dielectric layer and said substrate to form a trench;

filling said trench with a dielectric film to form a shallow trench isolation;

removing said first dielectric layer;

forming a second conductive layer over said first conductive layer and said shallow trench isolation;

forming a second dielectric layer on said second conductive layer;

forming a first hard mask layer and a second hard mask layer sequentially on said second dielectric layer;

transferring a floating gate pattern into said second hard mask layer to expose said first hard mask layer;

etching said first hard mask layer to form a pattern and expose said second dielectric layer;

conformally forming a third dielectric layer over said second hard mask layer and said pattern;

etching back said third dielectric layer to form a spacer and expose said second dielectric layer;

etching said second dielectric layer to expose said second conductive layer; and removing said spacer, said second hard mask layer, said first hard mask layer and said second dielectric layer.

8. The method according to claim 7, wherein said first dielectric layer comprise a SiN layer.

9. The method according to claim 7, wherein said shallow trench isolation pattern is formed by forming a photoresist layer on said first dielectric layer, patterning said photoresist layer and etching said first dielectric layer, said first conductive layer, said pad oxide layer and said substrate by using said patterned photoresist layer as an etching mask.

10. The method according to claim 7, wherein said dielectric film comprises a high-density plasma oxide layer.

11. The method according to claim 9, wherein said first dielectric layer, said first conductive layer, said pad oxide layer and said substrate are etched by reactive ion etching processes.

12. The method according to claim 7, when said trench is filled, a chemical mechanical polishing process is then performed to provide a planar surface and said dielectric film is then etched to a surface level of said first conductive layer.

13. The method according to claim 7, wherein said third dielectric layer comprises a polymer layer.

14. A method for forming a floating gate structure of a flash memory, said method comprising:

providing a substrate having a pad oxide layer, a first polysilicon layer and a first dielectric layer thereon;

transferring a shallow trench isolation pattern into said pad oxide layer, said first polysilicon layer, said first dielectric layer and said substrate to form a trench;

filling said trench with a dielectric film to form a shallow trench isolation;

removing said first dielectric layer;

forming a second polysilicon layer over said first polysilicon layer and said shallow trench isolation;

forming a second dielectric layer on said second polysilicon layer;

forming a first hard mask layer and a second hard mask layer sequentially on said second dielectric layer;

transferring a floating gate pattern into said second hard mask layer to expose said first hard mask layer;

etching said first hard mask layer to form a pattern and expose said second dielectric layer;

conformally forming a polymer layer over said second hard mask layer and said pattern;

etching back said polymer layer to form a spacer and expose said second dielectric layer;

etching said second dielectric layer to expose said second polysilicon layer; and removing said spacer, said second hard mask layer, said first hard mask layer and said second dielectric layer.

15. The method according to claim 14, wherein said shallow trench isolation pattern is formed by forming a photoresist layer on said first dielectric layer, patterning said photoresist layer and etching said first dielectric layer, said first polysilicon layer, said pad oxide layer and said substrate by using said patterned photoresist layer as an etching mask.

16. The method according to claim 14, when said trench is filled, a chemical mechanical polishing process is then performed to provide a planar surface and said dielectric film is then etched to a surface level of said first polysilicon layer.

17. The method according to claim 14, wherein said floating gate pattern is formed by forming a photoresist layer on said second hard mask layer, patterning said photoresist layer and etching said second hard mask layer by using said patterned photoresist layer as an etching mask.

* * * * *